(12) United States Patent
Lin

(10) Patent No.: US 8,001,492 B2
(45) Date of Patent: Aug. 16, 2011

(54) EVALUATION METHOD FOR INTERCONNECTS INTERACTED WITH INTEGRATED-CIRCUIT MANUFACTURE

(75) Inventor: Wallace W. Lin, San Jose, CA (US)

(73) Assignee: Linden Design Technologies, Inc., San Jose, CA (US)

( * ) Notice: Subject to any disclaimer, the term of this patent is extended or adjusted under 35 U.S.C. 154(b) by 335 days.

(21) Appl. No.: 12/215,552

(22) Filed: Jun. 27, 2008

(65) Prior Publication Data

US 2009/0001369 A1 Jan. 1, 2009

Related U.S. Application Data

(60) Provisional application No. 60/946,943, filed on Jun. 28, 2007.

(51) Int. Cl.
*G06F 17/50* (2006.01)

(52) U.S. Cl. .................................. 716/51; 716/136
(58) Field of Classification Search .................. None
See application file for complete search history.

(56) References Cited

U.S. PATENT DOCUMENTS

| | | | | |
|---|---|---|---|---|
| 6,057,171 | A * | 5/2000 | Chou et al. | 438/15 |
| 6,304,097 | B1 * | 10/2001 | Chen | 324/765 |
| 7,111,257 | B2 * | 9/2006 | Robson et al. | 716/4 |
| 7,434,197 | B1 * | 10/2008 | Dolainsky et al. | 716/19 |
| 7,644,388 | B1 * | 1/2010 | Daldoss et al. | 716/21 |
| 7,653,519 | B1 * | 1/2010 | Overhauser | 703/1 |
| 7,653,888 | B2 * | 1/2010 | Habib et al. | 716/5 |
| 7,730,434 | B2 * | 6/2010 | Aghababazadeh et al. | 716/4 |
| 7,747,978 | B2 * | 6/2010 | Ye et al. | 716/21 |
| 7,790,340 | B2 * | 9/2010 | Progler | 430/5 |

* cited by examiner

*Primary Examiner* — Leigh Marie Garbowski

(57) ABSTRACT

A design and evaluation method for interconnect wires of integrated circuits is provided to detect, analyze and predict response of interconnect layout to integrated-circuit manufacture processes.

17 Claims, 9 Drawing Sheets

EVALUATION METHOD FOR INTERCONNECTS INTERACTED WITH INTEGRATED-CIRCUIT MANUFACTURE

CROSS-REFERENCE TO RELATED APPLICATION

This application claims priority of a provisional application, Ser. No. 60/946,943, filed on Jun. 28, 2007.

FIELD OF THE INVENTION

The present invention relates to interconnects in integrated circuits and more particularly to a layout design and evaluation method for interconnects interacting with IC manufacture.

BACKGROUND OF THE INVENTION

Trends in the design and manufacture of microelectronic dies, or integrated circuits (ICs) are toward increasing miniaturization, circuit density, robustness, operating speeds and switching rates, while reducing power consumption and defects in the ICs. ICs are made up of a tremendous number (e.g., millions to hundreds of millions) of devices (e.g., transistors, diodes, capacitors, etc.), with each component being made up of a number of delicate structures, manufactured through a number of process steps. As IC manufacture technology continues to evolve and manufacturing of smaller sized components and more compact ICs become reality, the delicate structures likewise become smaller, more compact, and correspondingly, more delicate.

At 90- and 65-nanometer technology nodes and beyond, many (e.g., 10 or more) layers of conductor wires are required to interconnect the many smaller, more compact and more delicate structures in the ICs in accordance with the design specifications. (Note that these many layers of interconnect conductor wires are insulated by a dielectric layer in between them. Such a dielectric layer is called an interconnect dielectric layer, an inter-wire dielectric layer, or an inter-wire-layer dielectric layer, hereafter.) Consequently, increasingly smaller, more compact and more delicate features of the interconnect conductor wires are becoming essential to handle such formidable task in the design and manufacture of the ICs. However, the smaller, more compact and more delicate interconnect conductor wire features are beginning to interact with the IC manufacturing processes, causing product yield loss. Such phenomena include, but not limited to, the interaction between the interconnect conductor wire features and the planarization process of the interconnect conductor and dielectric layers, the interaction between the interconnect conductor wire features and the lithography process that defines the interconnect conductor wire features, and the interaction between the interconnect conductor wire features and the plasma involved interconnect dielectric deposition and etch process or the plasma-involved interconnect conductor etch process.

The interaction between the interconnect conductor wire features and the planarization process of the interconnect conductor and dielectric layers such as, but not limited to, the chemical-mechanical polish (CMP) process, can cause non-uniformity of the conductor wire and dielectric thickness due to the dishing on the conductor wire surface and the erosion on the dielectric surface. Such effect reduces thickness of the interconnect conductor and dielectric layers, thus increasing the conductor wire resistance and the dielectric capacitance which can cause significant timing delays in circuits. Since there can be up to ten or more interconnect conductor and dielectric layers in the 65-nanometer technologies and beyond, the accumulated effect of the non-uniformity of the interconnect conductor wire and dielectric thickness can be formidable after all interconnect conductor and dielectric layers receive the planarization process.

The interaction between the interconnect conductor wire features and the lithography process can cause the conductor wires either short or open. Such interaction may increase or decrease the width and also change the shape of the conductor wires which run through the circuits. The lithography process defines and forms the physical features of the transistor gates in circuits in the case of polysilicon interconnect wires. The change of the transistor gate length, width or shape can either reduce the on-state drive current or increase the off-state leakage of the transistors, thus degrading transistor performance and therefore the circuit or product performance and yield.

The interaction between the interconnect conductor wire features and the plasma-involved interconnect dielectric deposition and etch process or the plasma-involved interconnect conductor etch process can cause damage to transistor gate oxides via the plasma induced charging current. Degradation of the transistor gate oxides by such effect has become one of the serious transistor reliability concerns in the industry.

To improve manufacturing yield loss, manufacture-friendly layout design of the products (circuits that make products) has become increasingly important. To achieve a good layout design as such, understanding how the interconnect conductor wire features, such as the width, length, shape, spacing, density, pattern, etc. of the conductor wires, interact with the IC manufacturing tools and processes associated with the interconnect conductor and dielectric planarization process, the interconnect conductor lithography process, and the plasma-involved interconnect dielectric deposition and etch and the interconnect conductor etch process is the key.

To date, a thorough and complete understanding of such interaction has not been rendered yet, partly because a thorough and complete design covering the best possible scenarios of the interconnect conductor wire features in product circuits has not been realized.

SUMMARY OF THE INVENTION

The present invention represents the following invented arts:
  (1) An arrangement of the integrated-circuit interconnect conductor wire layouts based on a basic layout environment element and a sensor where the environment interacts with the integrated-circuit manufacture processes and the sensor senses the response of the interaction.
  (2) A method of how to design test structures with the above interconnect conductor wire layout arrangement where the environment is varied with the best possible arrangement of the interconnect conductor wire features (including wire width, wire length, wire spacing, wire density, wire shape and wire pattern, floating wire, wire connected to nodes of devices including but not limited to transistors in IC layouts), and the sensor is varied with its location inside the environment, in order to capture accurately and thoroughly most of the possible reactions of the interconnect layout in IC design to the IC manufacture processes.
  (3) A method of how to evaluate accurately and thoroughly the reaction of the interconnect conductor wire layout to the IC manufacture processes in any location of any IC layouts, based on the data measured from test structures developed using the above IC interconnect layout arrangement and design.

The interconnect conductor wires include but not limited to polysilicon, copper, aluminum, gold and other metal conductors that are suitable to be used in IC products. The usage of these interconnect conductor wires includes but not limited to their connection between various elements and components, active or passive, that construct the circuits of the IC products. The above design and evaluation methods can be applied to any semiconductor or solid-state IC products made from materials including but not limited to silicon, germanium, gallium arsenide, gallium phosphide, Indium phosphide, or any other materials that are suitable to be used in IC products. The inter-wire dielectrics include any material that are suitable to be used in IC products.

The layout design of the test structures created by the above design method is translated into a photo mask by which these test structures are fabricated during IC manufacture processes. The reaction of the interconnect layout design in these test structures to the IC manufacture processes is preserved in silicon after the manufacture process. The preserved response in silicon can then be characterized and the underlying information extracted.

The accurate and thorough evaluation on the reaction of the interconnect conductor wire layout to the IC manufacture processes in any location of any IC layouts by the above evaluation method effectively provides useful insights and feedbacks to layout designers to improve the interconnect layout design in products, which consequently improves the manufacturing yield.

DETAILED DESCRIPTION

Figure 1A:
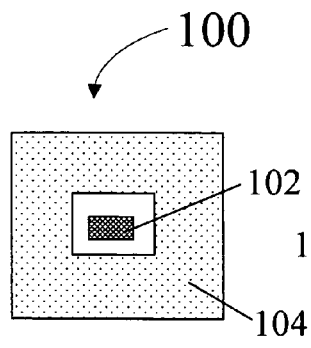
FIGS. 1A-1I are general top-view layout examples of an environment constructed with one or more fields of same or different features and one sensor.
Figure 1B:
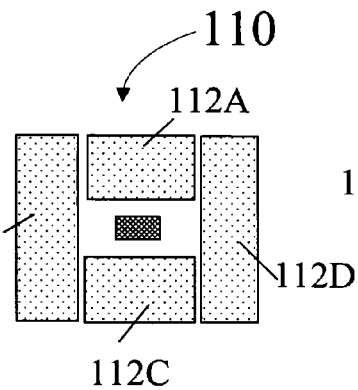
Figure 1C:
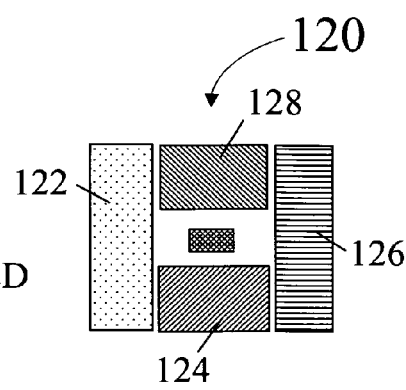
Figure 1D:
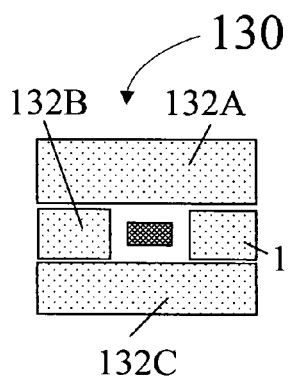
Figure 1E:
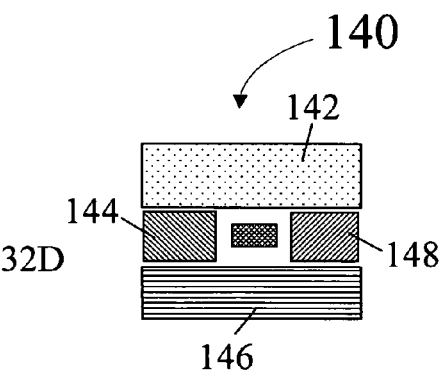
Figure 1F:
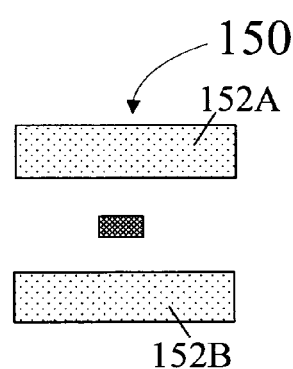
Figure 1G:
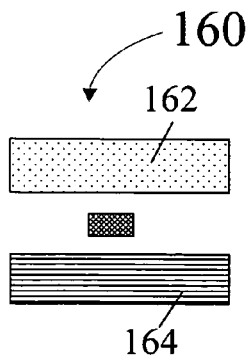
Figure 1H:
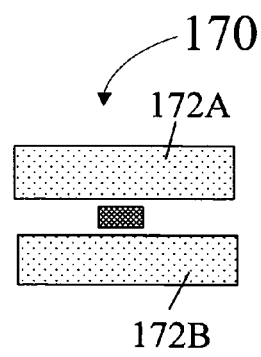
Figure 1I:
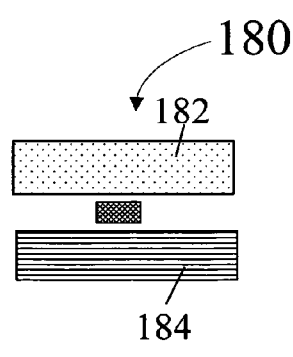
Figure 2A:
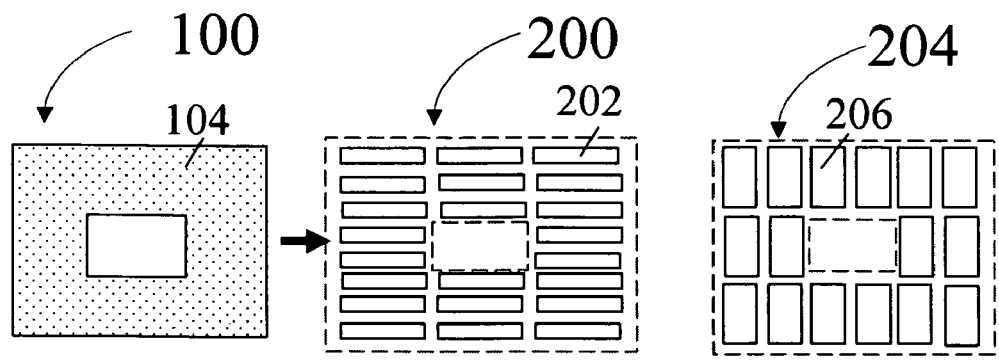
FIGS. 2A-2D are specific top-view layout examples of an environment constructed with one or more fields of same or different features.
Figure 2B:
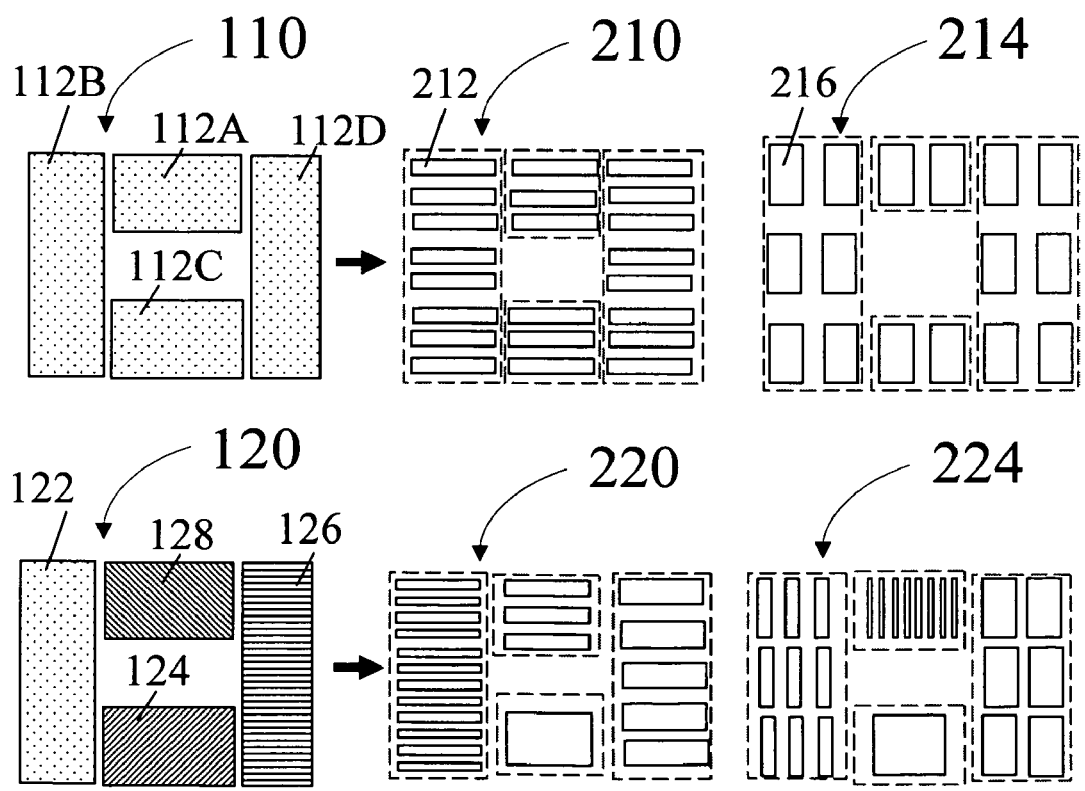
Figure 2C:
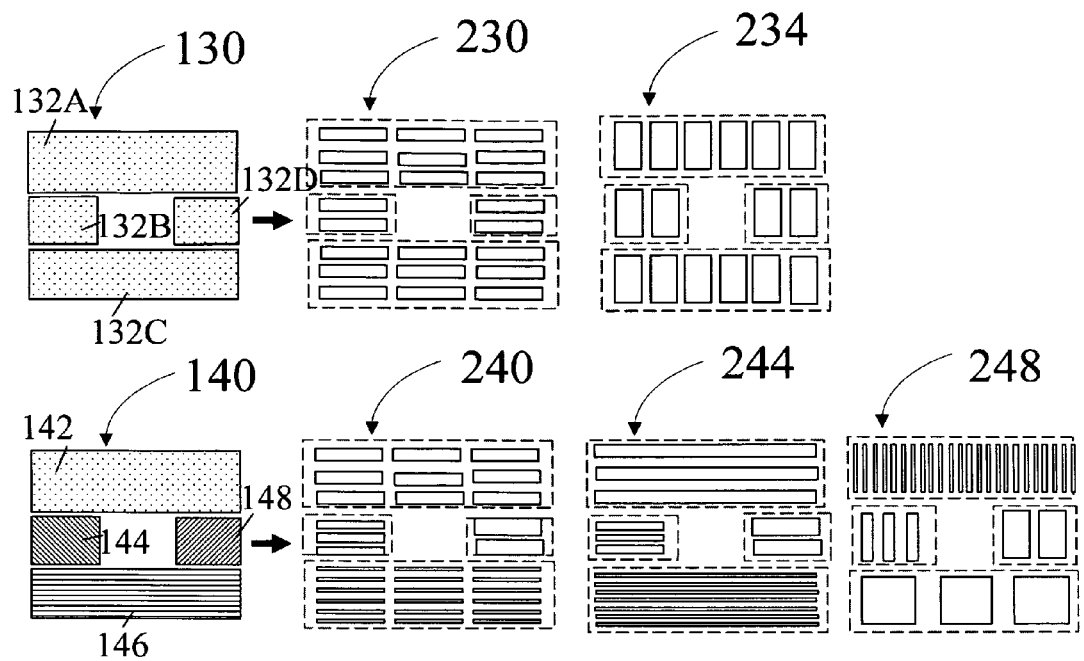
Figure 2D:
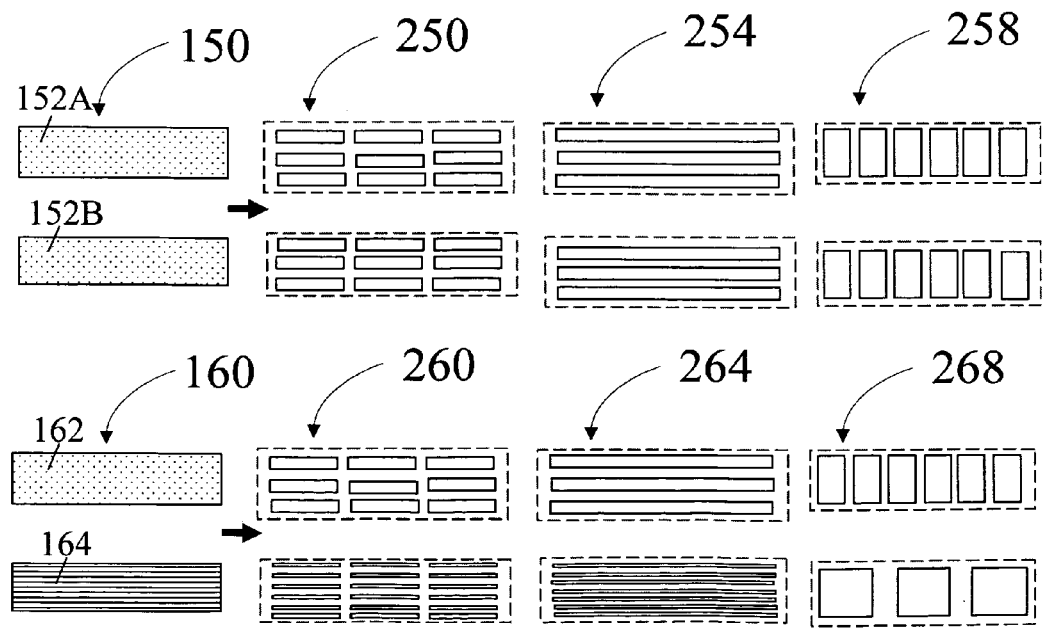

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

(Arrangement of Interconnect Conductor Wire Layout)

The following terminologies are introduced in the present invention. Their definitions are given in the following to help illustrate and explain this invention:

The Field: Constructed by interconnect conductor wires of any features (width, length, spacing, density, shape and pattern, etc.). In a given Field, all interconnect conductor wires within have a same feature. Interconnect conductor wires within separate Fields could also have a same feature.

The Environment: Constructed by one single Field or two or more separated Fields.

The Sensor: One single object of interconnect conductor wire of any width, length, shape, and spacing to the Field(s), or one single object of circuit component or element, active or passive, including but not limited to a transistor, a resistor, a capacitor or an inductor.

The Environment modulates the reaction or response caused by the interaction between the Environment and the IC manufacturing processes applied to this Environment. The Sensor acts as a sensing instrument to perceive the reaction or response. One Environment plus one Sensor constitute one test structure in the silicon.

FIGS. 1A to 1I illustrate, in a general case, the Environment, the Field(s) and the Sensor from a top view. One Environment can be constructed by one or more Fields. Environment 100 is constructed by one Field 104. A Sensor 102 is placed within the Field 104. Environments 110, 120, 130, 140, 150, 160, 170 and 180 are constructed with two or more Fields. In a given Field, all interconnect conductor wires within have a same feature which is represented by a same fill pattern in the illustrations. Interconnect conductor wires in the separate Fields can have same or different features which are represented by same or different fill pattern in the illustrations. For example, in FIG. 1, Fields 112A, 112B, 112C and 112D in Environment 110, Fields 132A, 132B, 132C and 132D in Environment 130, Fields 152A and 152B in Environment 150, and Fields 172A, 172B in Environment 170 all have a same feature, while Fields 122, 124, 126 and 128 in Environment 120, Fields 142, 144, 146 and 148 in Environment 140, Fields 162 and 164 in Environment 160, and Fields 182, 184 in Environment 180 all have different feature. Note that the shape of the Field is not necessarily the shape of rectangle or square as illustrated in FIG. 1. It can be of any shape, including but not limited to the shapes existing in any of the IC layout designs to date.

FIGS. 2A to 2D give the specific examples of an Environment and its constructing Field(s) from top view. The constructing conductor wires have a same feature in width, length, spacing, density, shape and pattern in a given Field. The Fields represented in these figures are the regions bounded by the dotted lines. The feature of the constructing conductor wires may be different from Field to Field. For example, Environments 200 and 204 are constructed by a single Field with a different-feature conductor wire element 202 and 206, respectively. Environments 210, 214, 230 and 234 are constructed with 4 Fields and Environments 250, 254 and 258 with 2 Fields only, with a same feature of conductor wires in their own multiple Fields. The 4 same-feature multiple Fields in Environment 210 are constructed with a conductor wire element 212. So in Environment 214 with a conductor wire element 216. Environments 220, 224, 240, 244 and 248 are constructed with 4 Fields and Environments 260, 264 and 268 with 2 Fields, with different features in their own multiple Fields. The features of the constructing wires can be of any shape and size, not necessarily be the shape of rectangles or squares only as shown in FIG. 2. They can be straight lines (wires) or pieces, comb-like lines, antenna-like lines, nested lines with 90-degree or rounded angle or any other angle(s), curved lines (wires) or pieces, etc. They can be floating or they can be connected to nodes of other wire lines or components or devices such as transistors, resistors, capacitors, inductors, etc.

Figure 3:
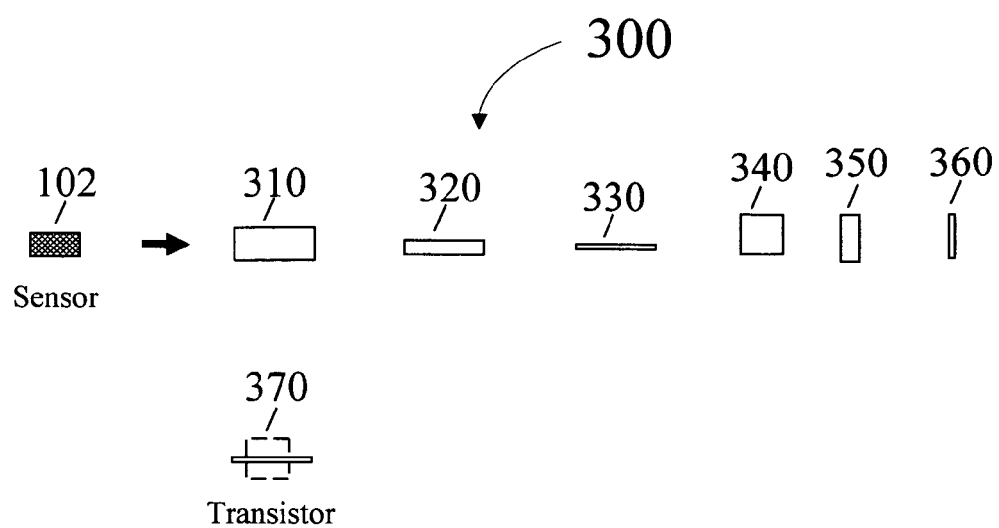
FIG. 3 is a general top-view layout example of a sensor which can be one of the different circuit elements with different width, length and shape.

Illustration 300 in FIG. 3 shows layout examples of a Sensor 102 from a top view. Sensor 310, 320, 330, 340, 350, 360 and 370 show that they can be of any shape, size and orientation. In reality, they can be straight or curved, and not limited to a rectangular or square as shown in this figure. A Sensor can be a transistor, conductor, resistor, capacitor, inductor, etc., depending on where (at which layer) it is located in the silicon circuits. Note that the dotted-line region of the the transistor Sensor 370 illustrated in FIG. 3 is a diffusion or doped silicon layer, not a conductor layer.

(Method of Design)

The method of the design is to first identify an Environment that is the most basic type to construct the IC interconnect layouts. This can be achieved by investigating many existing IC layout designs to identify the most basic-element Environments. By varying or scaling the dimension of an identified basic-element Environment and by arranging the varied and scaled basic-element Environments, all IC layouts can be reproduced. By placing the Sensor in varying locations of these dimension-varying Environments, it is expected that the most of the possible responses, if not all, from the interaction between the interconnect conductor wires and the IC manufacture processes would be completely and accurately captured in the silicon at the end of the IC manufacture processes.

Figure 4:
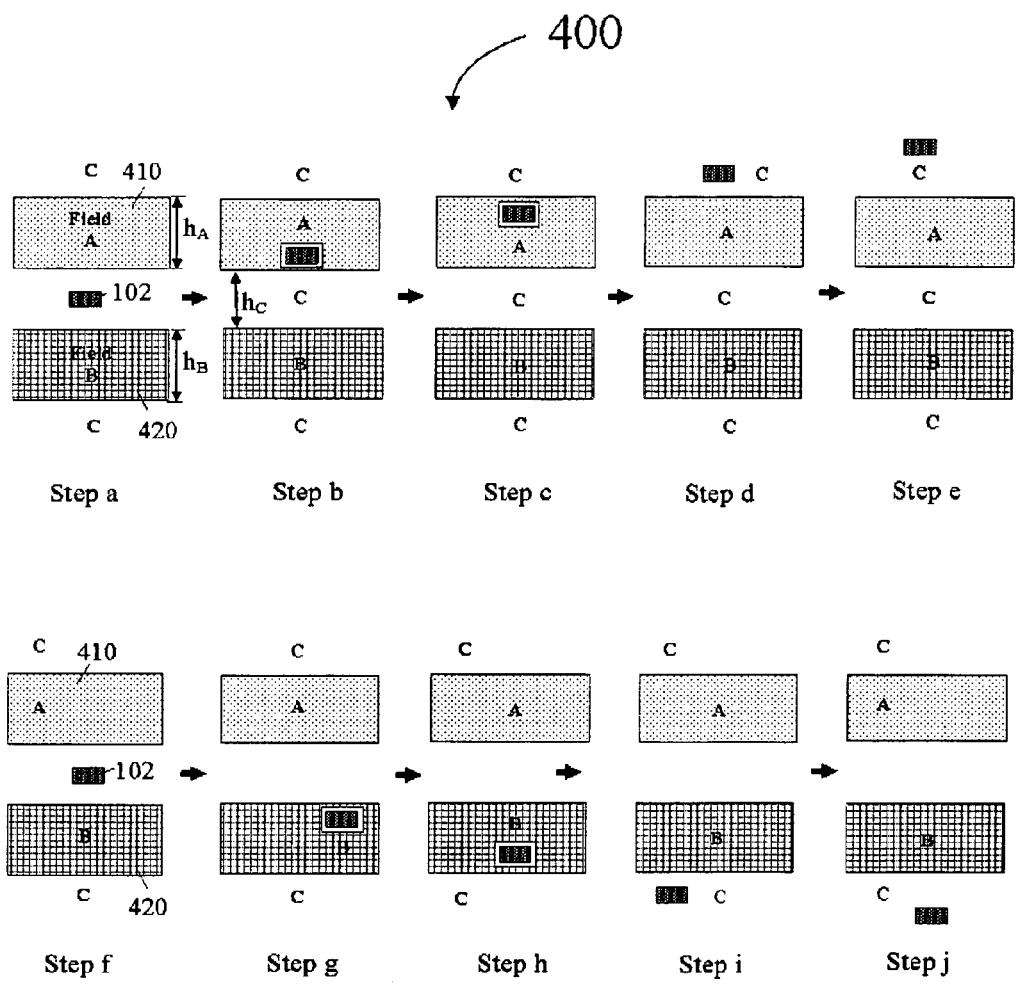
FIG. 4 is a general illustration of the design method.

Illustration 400 in FIG. 4 illustrates a general design method for interconnect test structures to accurately capture the response of the interaction between the interconnects and the IC manufacture processes. The simple Environment illustrated in Illustration 400 can be considered as a basic-element Environment constructing the IC layouts. It has two Fields, Field A (410) and Field B (420), side by side with a empty gap, a part of the empty Field C, in between. Fields A and B can have different or same interconnect conductor wire features within. In Illustration 400, the interconnect conductor wire features are different in Fields A and B. Field C is the total combined empty regions around Fields A and B. Field C has no interconnect conductor wires within. A Sensor 102 is placed at different locations of this basic-element Environment. In general, a typical IC layout is basically the repetition of such type of Environment with varied depth of Field A and Field B and of the Field-C gap region between Field A and Field B. By varying these Field depths, the interconnect conductor wire features within Fields A and B, and also the locations of the Sensor in this Environment, most of the possible responses, if not all, from the interaction between the interconnect conductor wire features and the IC manufacture processes in any location of an IC layout is expected to be captured. Each such designed Environment with a certain depth of Field A and Field B and of the Field-C gap region between Field A and Field B, a certain interconnect conductor wire feature within Fields A and B, and a certain location of the Sensor can be a "test structure" when it is implemented into a photo mask for silicon manufacture processes. From this "test structure" in silicon, the response of this certain Environment to IC manufacture processes can be measured after the manufacture processes.

Note that a Sensor can be placed in any of the different interconnect conductor wire layers to sense the response of the Environment constructed in that conductor wire layer to the IC manufacture processes. A Sensor can be of the same material of the interconnect conductor wire elements constructing the Environment. A Sensor can possess any features of the interconnect conductor wires including the conductor wire width, length, shape, etc. It can be a circuit component or element, active or passive, such as a transistor, resistor, capacitor, inductor, etc. It can exist below the interconnect conductor wire layers, such as a transistor. It serves as an instrument to measure or sense the reaction caused by the IC manufacture processes applied to the designed Environment at or above the interconnect conductor wire layer where this sensor is located.

Note that if the following three conditions are all satisfied, then the Environment constructed by these two Fields A and B may be considered as equivalent (i.e., deliver similar response to the Sensor) to the one fully and closely enclosing the Sensor, such as Environments 100, 110, 120, 130 and 140 illustrated in FIGS. 1A to 1E. Two such examples are Environments 170 and 180 illustrated in FIGS. 1H and 1I. These three conditions are (1) The two Fields, A and B, on the opposite sides of the Sensor are wide enough.
(2) The evaluation window, to be described below, covering the Sensor for evaluating the interaction response is well within the region between these two Fields.
(3) Field A and Field B are close enough with a narrow gap in between.

The Environment satisfying the above conditions is commonly seen in IC layout. Its application to IC interconnect layout can greatly simplify the test structure design that investigates the response from the interaction between a fully and closely enclosed interconnect conductor wire Environment and the IC manufacture processes.

The Steps a to e in Illustration 400 are the examples describing the general idea of the design for the location of the Sensor. In these steps, the Sensor moves, progressively, toward and into Field A and then out of Field A and into Field C. The purpose at each of these illustrated steps is given below:

Step a: Capture the response of Field C to the IC manufacture processes under the influence of both Field A and B.

Step b: Capture the response of Field A to the IC manufacture processes under more influence of Field C and less influence of Field B.

Step c: Capture the response of Field A to the IC manufacture processes under more influence of Field C and much less influence of Field B.

Step d: Capture the response of Field C to the IC manufacture processes under more influence of Field A and less influence of Field B.

Step e: Capture the response of Field C to the IC manufacture processes under less influence of Field A and much less influence of Field B.

The Steps f to j in Illustration 400 describe the same idea with the Sensor moving toward the opposite direction. The Sensor moves, progressively, toward and into Field B and then out of Field B and into Field C. The purpose of the steps is:

Step f: Capture the response of Field C to the IC manufacture processes under the influence of both Field B and A.

Step g: Capture the response of Field B to the IC manufacture processes under more influence of Field C and less influence of Field A.

Step h: Capture the response of Field B to the IC manufacture processes under more influence of Field C and much less influence of Field A.

Step i: Capture the response of Field C to the IC manufacture processes under more influence of Field B and less influence of Field A.

Step j: Capture the response of Field C to the IC manufacture processes under less influence of Field B and much less influence of Field A.

Note that the depth of Fields A and B, $h_A$ and $h_B$, and the depth of Field-C gap region between Field A and Field B, $h_C$, are varied in a range from low (tens of micron meters or the depth of a field with few interconnect conductor wires in parallel) to high (hundreds of micron meters or the depth of a field with many interconnect conductor wires in parallel) so that the response of the non-uniformity, i.e., short-range uniformity, or the response of the abrupt change of the interconnect conductor wire features in Fields A and B as well as the response of the longer-range uniformity of these wire features to the IC manufacture processes can all be captured.

Figure 5:
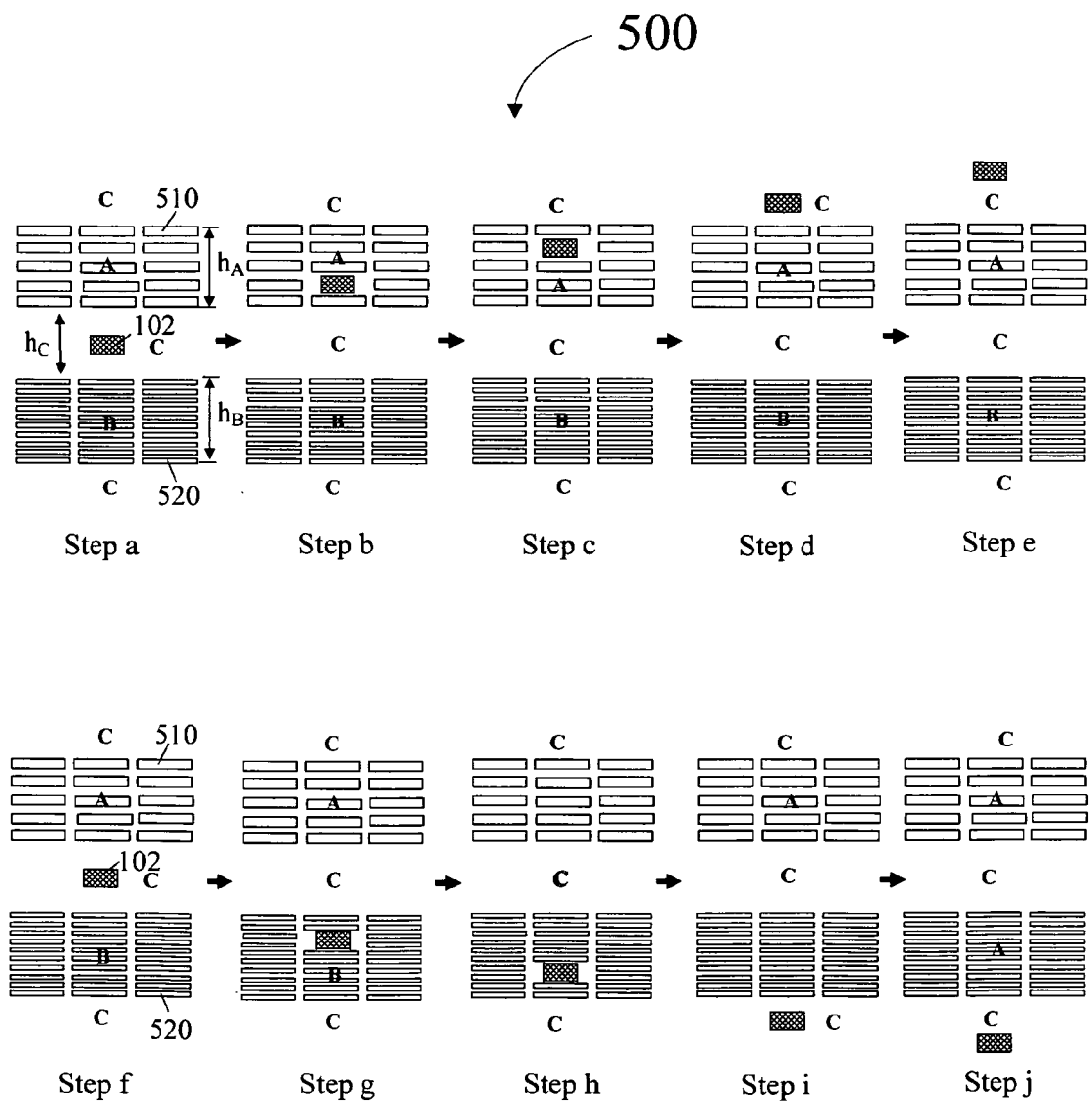
FIG. 5 is specific example of the design method.

Illustration 500 in FIG. 5 is a specific example of the design method. The basic Environment element shown resembles the basic cases in IC layout design with Fields A and B comprising narrower rectangle-shaped wires. Three groups of variables are varied here. They are (1) the location of the Sensor 102; (2) the depth of Fields A and B, $h_A$ and $h_B$, and the depth of Field-C gap region between Fields A and B, $h_C$; (3) the interconnect conductor wire features such as the wire width, wire length, wire spacing, wire density, wire shape, wire pattern, etc., within Fields A and B. Fields A and B are comprised of the conductor wire element 510 and 520 respectively. An IC layout design can be a repetition and arrangement of such basic Environments here with varying the above three groups of variables. Note that the interconnect conductor wires are not limited to run only horizontally as illustrated in this specific example. In reality, they can run horizontally or vertical in IC layout design. They perhaps can also run in any other angles in the future, if not at present.

(Method of Evaluation)

The response from the Environment is perceived by the Sensor. The response of the Environment can be in the form of the measurement parameters measured by any instruments that are adequate to retrieve the response signals perceived by the Sensor. These measurement parameters include parameters from but not limited to the electrical and physical measurements. These parameters include the interconnect conductor wire properties such as the resistance, the thickness, and the width of the conductor wires if the Sensor is an interconnect conductor wire itself. These parameters can also be the interconnect dielectric properties such as the capacitance, the thickness, etc. of the inter-wire-layer oxide between the conductor layers.

If the Sensor is a transistor, the measured parameters can be any transistor parameters that can be affected by the reaction between the designed Environment, at the interconnect conductor wire layers above the layer where the sensing transistor is located, and the IC manufacture processes applied to this Environment. One example here is the parameters related to the transistor gate oxide as it is known that the plasma-involved back-end IC manufacture processes forming the interconnect conductor wires has a strong impact to the transistor gate oxides if these formed conductors wires are connected to the nodes of the transistors.

These parameters measured by the Sensor are then analyzed against the variables of the designed environment such as the width, length, spacing, density, shape and pattern of the interconnect conductor wires constructing the Environment.

Figure 6:
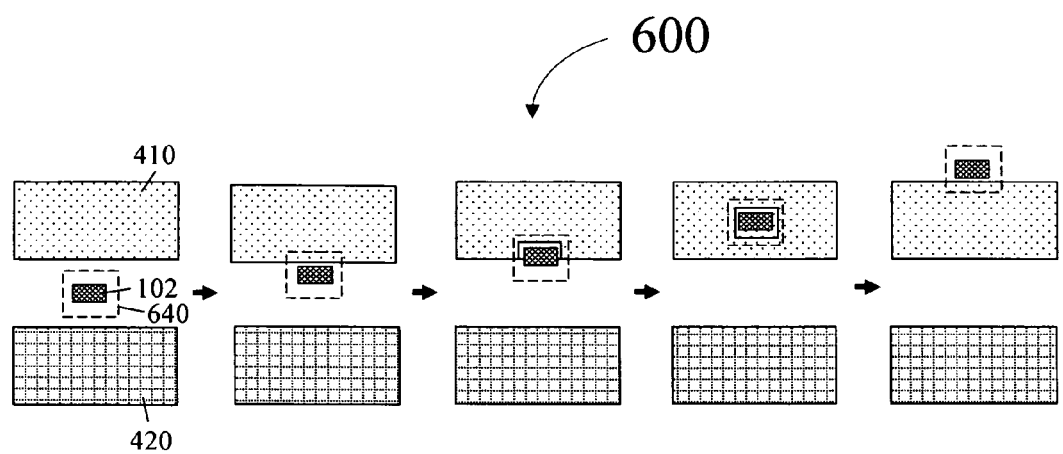
FIG. 6 is a general presentation of the evaluation method.
Figure 7:
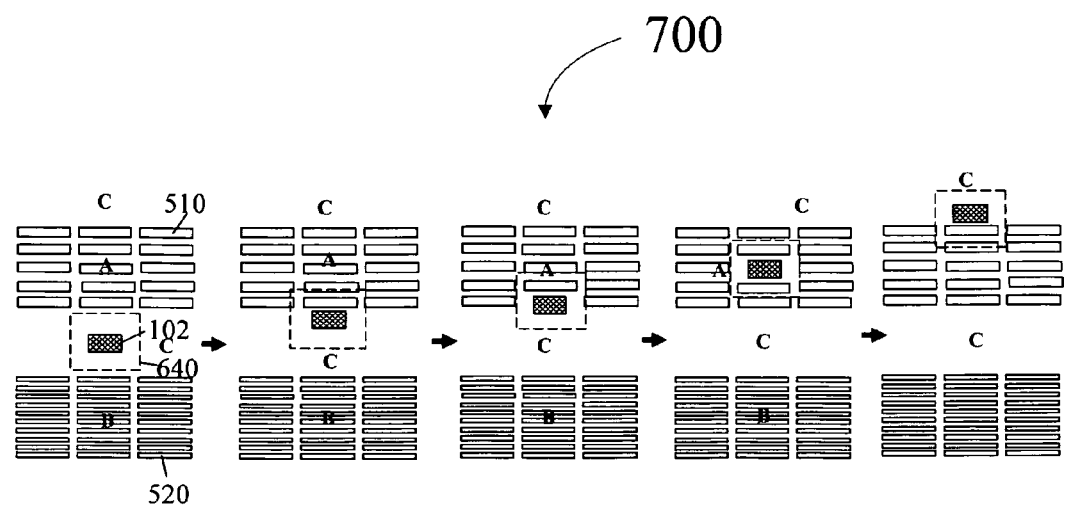
FIG. 7 is a specific example of the evaluation method.

In order to accurately predict the response of the interconnect design to the IC manufacture processes in any location of an IC design layout, an evaluation window that scans the entire IC layout and accurately computes the response based on the measured response signal data obtained from the designed test structures is required. Illustration 600 in FIG. 6 (a general presentation) and Illustration 700 in FIG. 7 (a specific presentation) show such an evaluation window 640 implemented in the layout of the test structures. An optimum evaluation window can be extracted through an algorithm comprising an iterative procedure of progressive steps. This iterative procedure is expressed by a flow diagram 800 in FIG. 8. The algorithm involves (1) Setting a shape and size for an evaluation window;
(2) Setting formulae of an equivalent set of interconnect conductor wire features as a function of the original interconnect conductor wire features;
(3) Computing the equivalent set of interconnect conductor wire features within the evaluation window for the interconnect layout of all designed test structures;
(4) Least-square fitting measured response signal data from all designed test structures versus the equivalent set of interconnect conductor wire features;
(5) Computing the overall least-square fitting error.

Based on the result from each of the iterations, one should expect to single out an evaluation window of optimum size and shape that yields a minimum least-square fitting error, and consequently the computing formulae of the equivalent set of interconnect conductor wire features as well as that of the responses to the IC manufacture processes as a function of the equivalent set of interconnect conductor wire features under this selected optimum evaluation window.

The equivalent set of interconnect conductor wire features comprise three elements, the equivalent wire width (w'), wide spacing (s'), and wire density (d'). They are expressed in a general form as a function of the original interconnect conductor wire features below:

$$w'=w'(w,l,s,d,sh,p) \tag{1}$$

$$s'=s'(w,l,s,d,sh,p) \tag{2}$$

$$d'=d'(w,l,s,d,sh,p) \tag{3}$$

Figure 9:
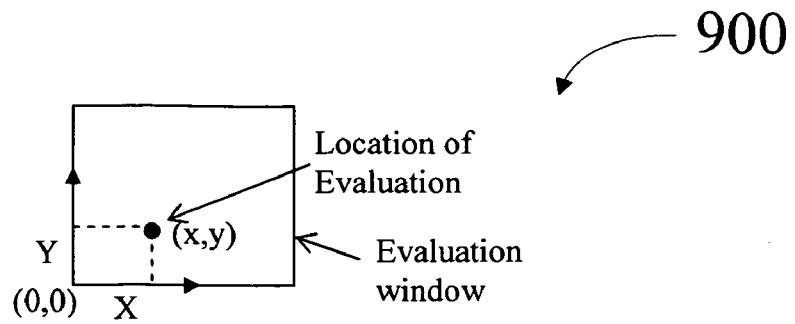
FIG. 9 is an illustration of a rectangular-shaped evaluation window with an orthogonal coordinate system.

Note that w, l, s, d, sh, and p (width, length, spacing, density, shape and pattern) vary as a function of the evaluation location within the evaluation window. They can be expressed as $$w=w(x,y) \tag{4}$$

$$l=l(x,y) \tag{5}$$

$$s=s(x,y) \tag{6}$$

$$d=d(x,y) \tag{7}$$

$$sh=sh(x,y) \tag{8}$$

$$p=p(x,y) \tag{9}$$

where x and y are the coordinates of the orthogonal coordinate system used in the evaluation window as illustrated by Illustration 900 in FIG. 9, if the evaluation window has a rectangular shape.

These equivalent parameters, within an evaluation window of the size and shape of choice, take into account the effect of the original variables of the Environments which may not be constant values even in a tiny evaluating-window-size area of the IC layout. This equivalent parameter approach reduces the number of the variables in the analysis and greatly simplifies the analysis effort.

Figure 8:
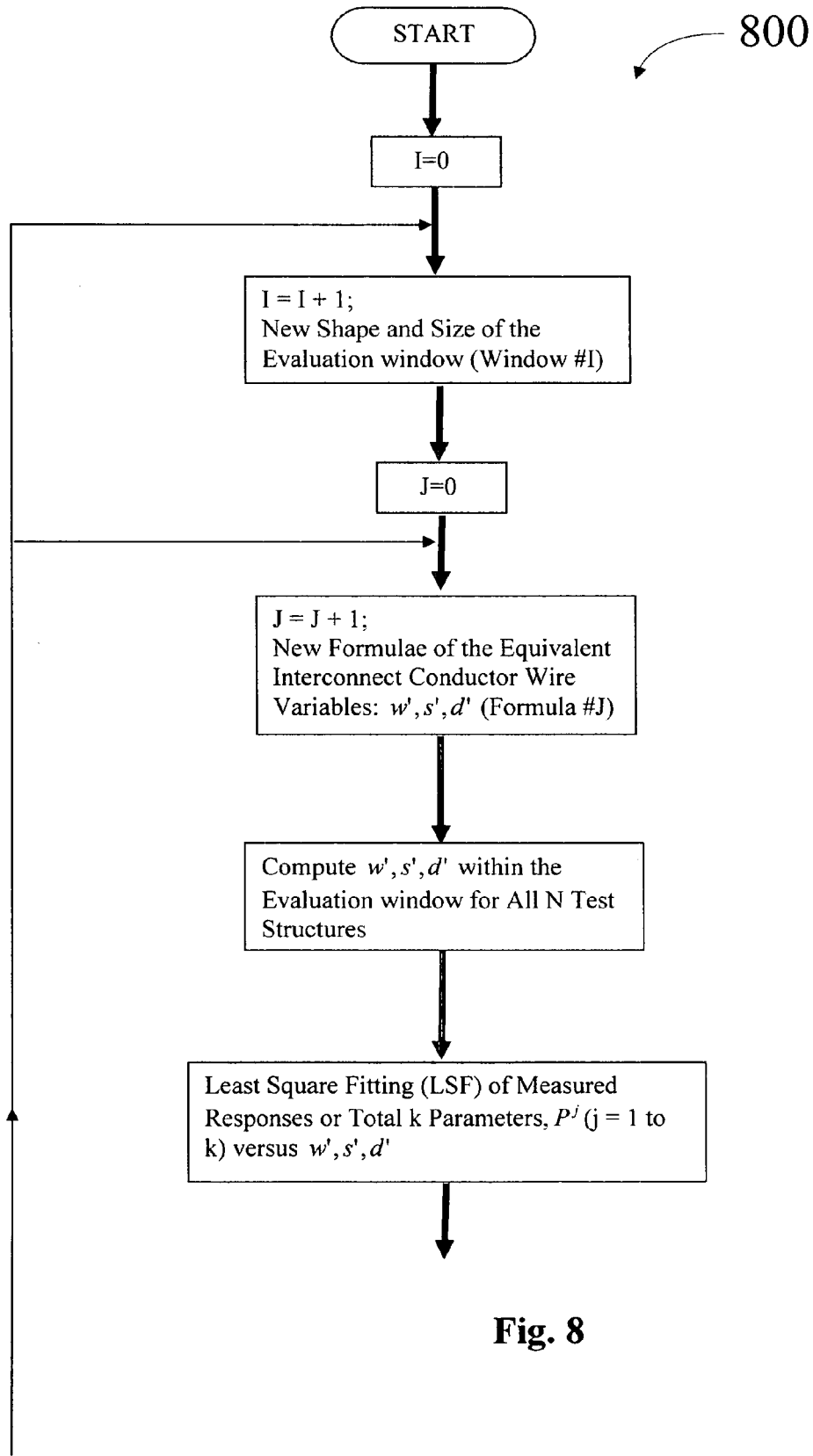
FIG. 8 is a flow diagram explaining the algorithm for deriving the optimum evaluation window and calculating the equivalent features and response of the interconnect conductor wires within the derived evaluation window.

The algorithm in the flow diagram 800 in FIG. 8 that arrives at the best possible representation of the interconnect conductor wire variables and the optimum shape and size of the evaluation window is explained in detail as follows. A number (total number is L) of the evaluation windows varied with different window shape and size in conjunction with a number (total number is M) of the formulae for computing the equivalent w', s' and d' are applied in this algorithm. In a given evaluation window, total of M formulae are applied to least-square-fit (LSF) the k measured responses (from total of N test structures), $P^j$, j=1 to k, [for example, $P^j$ can be a response such as the interconnect conductor wire thickness or resistance, the inter-wire-layer dielectric thickness or capacitance, the interconnect conductor wire dishing amount, the inter-wire-layer dielectric erosion amount, and their statistical information such as their standard deviation (sigma), etc.] versus w', s', and d'. The normalized LSF residues of these measured responses and their combined are then calculated. The LSF residue of the response or parameter $P^j$ is defined as $$Res(P^j) = \sqrt{\sum_i^N (P_{mi}^j - P_{fi}^j)^2} \quad (10)$$

where $P_{mi}^j$ and $P_{fi}^j$ are measured and fitted value of the $j^{th}$ parameter or response for the $i^{th}$ test structure.

The normalized LSF residue for parameter $P^j$ is defined as $$Norm[Res(P^j)] = \frac{\sqrt{\sum_i^N (P_{mi}^j - P_{fi}^j)^2}}{\overline{P^j}} \quad (11)$$

where $$\overline{P^j} = \frac{\sum_i^N P_{mi}^j}{N} \quad (12)$$

The normalized combined LSF residue for total k multiple parameters $P^1$ to $P^k$ is $$\sum_{j=1}^k \{Norm[Res(P^j)]\}$$

Note that aside from the above LSF fitting procedure and the fitting evaluation based on minimum normalized LSF residues and/or the multiple-variable combined minimum LSF residue, other fitting means based on multiple-variable linear regression may also be able to carry out the same evaluation task.

After going through all the evaluation window shapes and sizes, the choice of the evaluation window and the computing formulae of the equivalent interconnect conductor wire variables and consequently the formulae of the responses are determined by whichever (I,J) value that gives the minimum normalized combined LSF residue of the measured responses. Finally, the information on the evaluation window size and shape and the computing formulae of the equivalent interconnect wire feature variables and the responses are recorded and saved.

Figure 10:
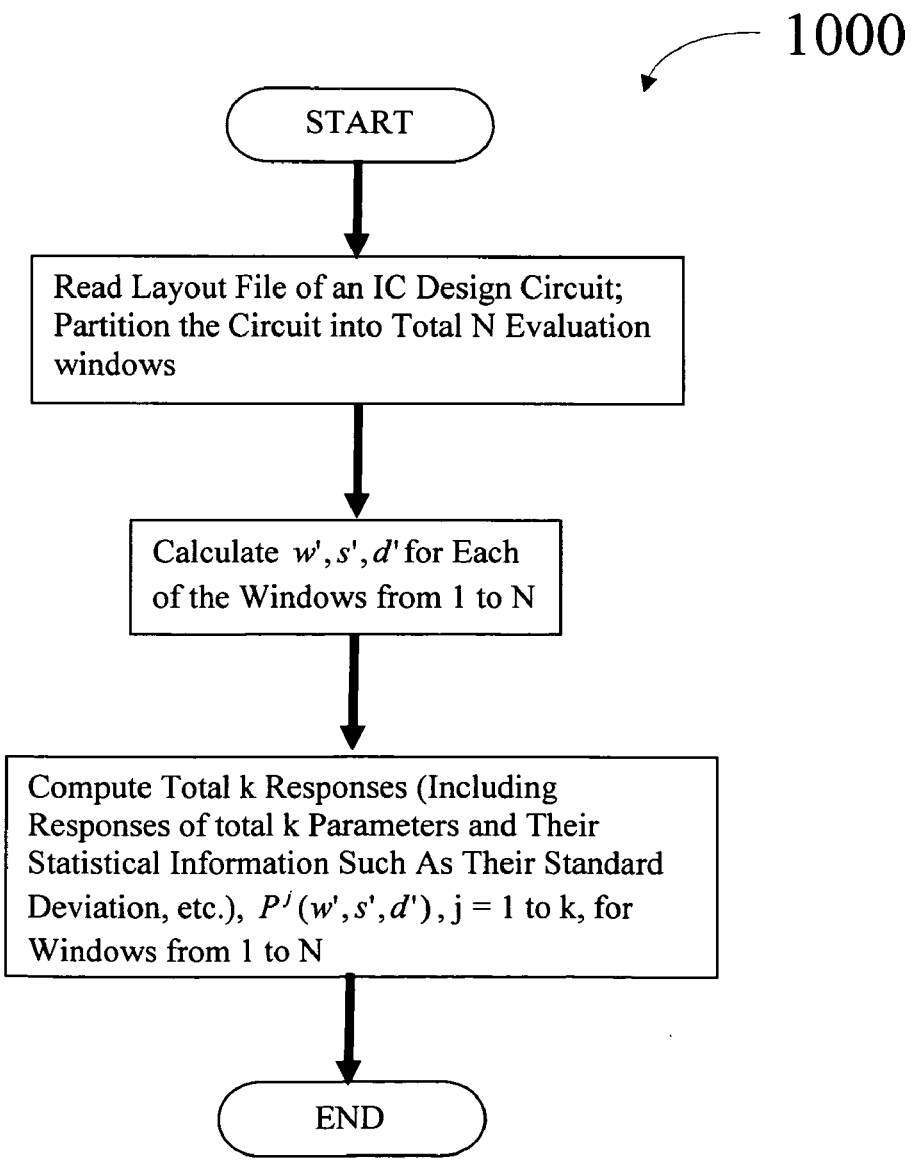
FIG. 10 is a flow diagram explaining the algorithm for computing the response of the interconnect conductor wires to the IC manufacture processes, in any locations of an IC layout.

Once the size and shape of the evaluation window and the computing formulae of the equivalent interconnect wire feature variables and the responses within the evaluation window are finalized, they can be applied to evaluate any IC layout by computing the responses, $P^j$, j=1 to k, to the IC manufacture processes, in any locations of the IC layout. The layout is first partitioned into windows with size and shape same as those of the evaluation window, then computation for the responses are performed in every window. This procedure is described by a flow diagram 1000 shown in FIG. 10.

The present invention may be practiced as a software invention, implemented in the form of a machine-readable medium having stored thereon at least one sequence of instructions that, when executed, causes a machine to effect the invention. More particularly, in addition to being physically embodied in physical IC circuit layouts, embodiments of the present invention may also be practice in virtual (but tangible) form where codes stored on a machine-readable medium contains a configuration of an IC circuit layout having the IC interconnect conductor wire layout arrangement. Such should be interpreted as being within a scope of the present invention (i.e., claims). With respect to the term "machine", such term should be construed broadly as encompassing all types of machines, e.g., a non-exhaustive listing including: computing machines, non-computing machines, communication machines, etc. Similarly, with respect to the term "machine-readable", such term should be construed broadly as encompassing a broad spectrum of mediums, e.g., a non-exhaustive listing including: magnetic medium (floppy disks, hard disks, magnetic tapes, etc.), optical medium (CD-ROMs, DVD-ROMs, etc.), etc.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method for designing interconnect conductor wires interacted with integrated-circuit manufacture processes, comprising:
    arranging a basic-element interconnect conductor wire layout environment using a computer;
    varying and scaling the dimension of a basic-element layout environment and the features of the constituting interconnect conductor wires to create a plurality of environments; and
    placing a sensor in varying locations of each of the plurality of environments to form a plurality of test structures.

2. The method as claimed in claim 1, wherein the layout environment further comprising one or more fields constructed with interconnect conductor wires.

3. The method as claimed in claim 2, wherein the interconnect conductor wires have a same feature in one field and same or different features in two or more separated fields.

4. The method as claimed in claim 1, wherein the sensor is one of the following: a conductor, a resistor, a capacitor, an inductor, and a transistor.

5. The method as claimed in claim 1, wherein the interconnect conductor is a metal conductor or a polysilicon conductor.

6. The layout environment in the method as claimed in claim 1, wherein the features of the constituting interconnect conductor wires are width, length, area, density, spacing, angle, shape and pattern of the wire including floating wire, wire connected to at least one node of other conductor wires, and wire connected to at least one node of devices belonging to at least one of the following device categories: transistor, resistor, capacitor and inductor.

7. The method as claimed in claim 1, wherein the basic-element layout environment is an environment with two fields side by side and an empty gap in between, its dimension including depth of the two fields and the gap, and its repetition enabling formation of an entire IC layout.

8. The method as claimed in claim 1, wherein placing a sensor in varying locations of each of the plurality of environments comprises moving the sensor from the gap into, and then out of, each of the two fields in each of the plurality of environments.

9. The method as claimed in claim 1, further comprising a non-transient machine-readable medium having stored thereon at least one sequence of instructions that, when executed, causes a machine to implement the method.

10. A method for evaluating the interaction between the interconnect conductor wire layout and the IC manufacture processes for an IC circuit design layout, comprising:
    extracting an optimum evaluation window using a computer; and
    computing interaction response between the interconnect conductor wire layout and the IC manufacture processes within the optimum evaluation window for an IC circuit design layout.

11. The method as claimed in claim 10, wherein the optimum evaluation window is a window with optimum size and shape being able to yield minimum error between the measured and computed interaction between the interconnect conductor wire layout and the IC manufacture processes for of all test structures.

12. The method as claimed in claim 10, wherein extracting an optimum evaluation window further comprising:
    forming a plurality of test structures physically via integrated-circuit manufacture processes;
    measuring interaction data from the plurality of the test structures; and
    analyzing the measured interaction data from the plurality of the test structures with an algorithm.

13. The method as claimed in claim 12, wherein the integrated-circuit manufacture processes forming the plurality of the test structures is a planarization process, a lithography process, or a plasma-involved process that directly or indirectly contribute to forming interconnect conductor wires and dielectrics in the integrated circuits.

14. The method as claimed in claim 12, wherein measuring interaction data comprising measuring any electrical and physical properties of the sensor, including current, voltage, resistance, capacitance, inductance, thickness, length, and width of, or relating to, the sensor.

15. The method as claimed in claim 12, wherein the algorithm of analyzing the measured interaction data from the plurality of the test structures, further comprising an iterative procedure of progressive steps:
    setting the size and shape of the evaluation window;
    setting formulae of reducing the features of the interconnect conductor wire into the feature of three variables, equivalent width, spacing and density within the evaluation window and computing their values;
    least-square fitting the measured interaction data versus the equivalent wire width, spacing and density and computing the total fitting error,
    selecting an evaluation window corresponding to a minimum total fitting error as the optimum evaluation window; and
    recording the computed formulae of the equivalent wire width, spacing and density and the computed interaction responses to the IC manufacture processes under the selected optimum evaluation window.

16. The method as claimed in claim 10, wherein computing interaction response for an IC circuit design layout further comprising:
    partitioning the IC circuit design layout into windows with the same size and shape of the optimum evaluation window;
    computing the interaction responses in every partitioned window; and
    recording the computed interaction responses.

17. The method as claimed in claim 10, further comprising a non-transient machine-readable medium having stored thereon at least one sequence of instructions that, when executed, causes a machine to implement the method.

* * * * *